United States Patent
Braun et al.

(10) Patent No.: US 7,376,802 B2
(45) Date of Patent: May 20, 2008

(54) MEMORY ARRANGEMENT

(75) Inventors: Georg Braun, Holzkirchen (DE); Hermann Ruckerbauer, Moos (DE); Maksim Kuzmenka, Munich (DE); Siva Raghuram, Germering (DE)

(73) Assignee: Infineon Technologies AG, Munich (DE)

( * ) Notice: Subject to any disclaimer, the term of this patent is extended or adjusted under 35 U.S.C. 154(b) by 269 days.

(21) Appl. No.: 10/850,382

(22) Filed: May 21, 2004

(65) Prior Publication Data

US 2005/0038966 A1 Feb. 17, 2005

(30) Foreign Application Priority Data

May 23, 2003 (DE) ................. 103 23 415

(51) Int. Cl.
*G06F 12/00* (2006.01)
*G06F 13/00* (2006.01)

(52) U.S. Cl. ........................ 711/154; 711/167
(58) Field of Classification Search .......... 711/154
See application file for complete search history.

(56) References Cited

U.S. PATENT DOCUMENTS

| | | | |
|---|---|---|---|
| 5,357,619 A * | 10/1994 | Crook et al. ............ | 711/2 |
| 5,513,327 A | 4/1996 | Farmwald et al. | |
| 5,596,738 A * | 1/1997 | Pope ..................... | 711/103 |
| 5,657,288 A * | 8/1997 | Dent ..................... | 365/230.02 |
| 5,680,567 A * | 10/1997 | Dent ..................... | 711/220 |
| 6,502,161 B1 | 12/2002 | Perego et al. | |
| 6,810,444 B2 * | 10/2004 | Kimura .................. | 710/27 |
| 6,950,921 B2 | 9/2005 | Hottgenroth | |
| 7,102,553 B2 * | 9/2006 | Tokuhiro ............... | 341/101 |
| 2002/0041527 A1 * | 4/2002 | Tanaka et al. ......... | 365/200 |
| 2002/0129197 A1 | 9/2002 | Hottgenroth | |
| 2003/0123319 A1 * | 7/2003 | Kim ..................... | 365/233 |
| 2003/0174547 A1 * | 9/2003 | Nakata et al. .......... | 365/191 |
| 2005/0144369 A1 * | 6/2005 | Jaspers ................. | 711/105 |

FOREIGN PATENT DOCUMENTS

DE          101 08 820 A1      9/2002
WO     WO 2004088851 A1 *    10/2004

OTHER PUBLICATIONS

Mooney, R. et al., "A 900 Mb/s Bidirectional Signaling Scheme", IEEE Journal of Solid-State Circuits, vol. 30, Iss. 12, pp. 1538-1543, Dec. 1995.*
Mooney, R. et al., "A 900 Mb/s Bidirectional Signaling Scheme", Solid-State Circuits Conference, 1995. Digest of Technical Papers. 42nd ISSCC, 1995 IEEE International, pp. 38-39, 337, Feb. 1995.*

* cited by examiner

*Primary Examiner*—Matthew Kim
*Assistant Examiner*—Michael Krofcheck
(74) *Attorney, Agent, or Firm*—Slater & Matsil, L.L.P.

(57) ABSTRACT

The present invention relates to a memory arrangement having a controller and having at least one memory device. Data signals, control signals and address signals can be transferred between the controller and the memory device. The memory arrangement is designed in such a way that the data signals can be transferred via data signal lines between the controller and the memory device. The memory arrangement is furthermore designed in such a way that the control signals and the address signals can likewise be transferred via the data signal lines between the controller and the memory device.

4 Claims, 1 Drawing Sheet

MEMORY ARRANGEMENT

BACKGROUND

1. Field

The present invention relates to a memory arrangement having a controller and having at least one memory device.

2. Background Information

Digital computers such as personal computers, laptops, servers, workstations always contain, in addition to one or more central computers (usually referred to as "processors"), additional electrical functional units that cooperate with the processor as peripheral units. At least one of the peripheral units is also always a memory arrangement having a controller and having at least one memory device. Such a memory arrangement serves to supply the processor with data from the memory device (a so-called read operation, since data are read from memory cells of the memory device) or to store data obtained from the processor in memory cells of the memory device (a so-called write operation, since data are written to memory cells of the memory device).

In order to relieve the burden on the processor, the controller is arranged between the processor and the memory devices. Its purpose is to convert requests received on the part of the processor for the memory devices (e.g. write or read operation, addressing data and memory data) into corresponding signals for the memory devices and also to communicate correspondingly with the memory devices and the processor. Such an arrangement comprising controller and memory devices is referred to as a "memory arrangement" in the present case.

Modern processors have a high operating speed (the operating frequency is in the meantime>2.5 GHz); whereas memory devices such as e.g. of the RAM, ROM or flash type always have a significantly lower operating speed than a modern processor. Therefore, it has always been an aim to design memory arrangements in such a way that an operating speed that is as high as possible can be achieved with them.

It has been shown in the past that, in cases in which a changeover is to be made from a write operation to a read operation, or vice versa, i.e. in which a changeover is to be made from read operation to write operation, it is necessary to accept waiting times that are given under specific addressing conditions before the line system present in the memory devices, in particular, functions properly again. This is caused inter alia by capacitive loading of the line system in the memory devices. Such changeover processes take place relatively frequently: the operation of a memory arrangement is usually made up of approximately 70% reading operation (i.e. read accesses are made to the memory cells of the memory devices) and approximately 30% writing operation (i.e. data are written to the memory cells of the memory devices). Consequently, the waiting times described slow down the maximum possible operating speed of the entire memory arrangement.

SUMMARY

Therefore, a configuration of a memory arrangement is disclosed that can be operated faster than has been possible hereto.

A memory arrangement is disclosed that comprises a controller and having at least one memory device connected such that data signals, control signals and address signals can be transferred between the controller and the memory device; and data signal lines for transferring the data signals, the control signals, and the address signals between the controller and the memory device.

Another memory arrangement is disclosed, which comprises a controller and a plurality of memory devices, wherein data signals, control signals and address signals are transferred between the controller and the memory devices. Data signal lines transfer the data signals the control signals, and the address signals between the controller and the memory device. The number of memory devices is chosen such that the total number of data signals that can be transferred between the controller and the memory devices, together with the associated data signal lines, is at least equal to the total number of lines required for transferring the address signals and the control signals between the controller and one of the memory devices.

Further advantages, features and details of the invention emerge from the exemplary embodiments described below.

DETAILED DESCRIPTION

Figure 1:
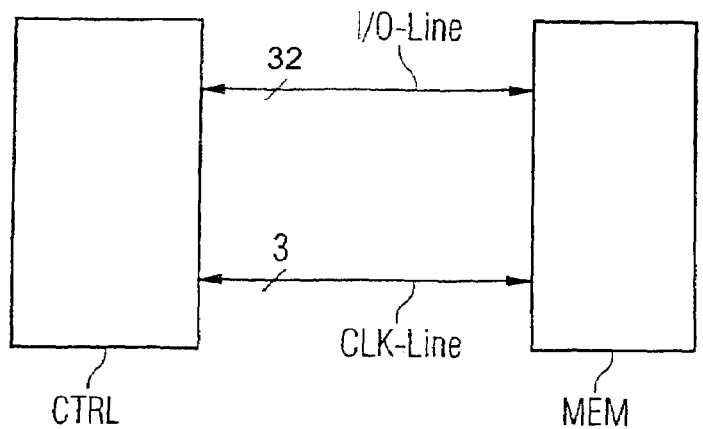
FIG. 1 shows a controller CTRL and a memory device MEM according to an embodiment of the present invention.

FIG. 1 shows a controller CTRL and a memory device MEM. The controller CTRL serves to drive the memory device MEM in such a way that data I/O are written (write operation) to the memory cells of the memory device MEM, and that data I/O written to the memory cells are read again from the memory cells (read operation). The controller CTRL may be assumed (not illustrated) to be part of a digital computer and, in particular, have a dedicated processor. The data I/O are exchanged between the controller CTRL and the memory device MEM via, for example 32 data lines I/O-line. As is known, however, the operation of a memory arrangement also requires further signals such as address signals A, control signals C and clock or strobe signals CLK. Usually, and thus also in the case of the memory arrangement according to the invention as shown in FIG. 1, the clock and/or strobe signals CLK are transferred via further lines between the controller CTRL and the memory device MEM, namely via clock signal lines CLK-line (of which there are assumed to be three). In order to transfer the address signals A and the control signals C (e.g. the signals usually designated by "RAS" and "CAS", respectively, which control the acceptance of the address signals A in the memory device MEM), the invention there provides for this likewise to be performed via the data lines I/O-line. For this purpose, use is made of a data transfer principle called "SBD" (="Simultaneous Bidirectional Signaling"), which was presented in the Article "A 900 Mb/s Bidirectional Signaling Scheme" by Randy Mooney, Charles Dike and Shekhar Borkar, published in "IEEE Journal of Solid-State Circuits", Vol. 30, No. 12, December 1995, on pages 1538 to 1543: according to this, it is possible to simultaneously transfer two different signals in two different directions via one electrical line. For this purpose, it is necessary to provide both a driver circuit and a receiver circuit at both ends of the line. This and possible configurations in this respect are illustrated in detail in the abovementioned article.

The controller CTRL and the memory device MEM are usually already equipped with driver and receiver circuits anyway in order to be able to operate the data lines I/O-line bi-directionally with respect to the data signals I/O, since these data are usually transferred via one and the same data lines I/O-line both in read operation and in write operation. Thus, the driver and receiver circuits only have to be adapted to the SBD operation, as described in the abovementioned article, and be connected to those circuit sections of the controller CTRL and the memory device MEM which are responsible for handling the control signals C and the address signals A.

Thus, in write operation, the data signals I/O (i.e. the data to be written to the memory cells of the memory device MEM) and the control signals C and the address signals A are transferred serially in succession from the controller CTRL into the memory device MEM via the data lines I/O line. In read operation, by contrast, the data signals I/O (i.e. the data read from the memory cells of the memory device MEM) and the control signals C and the address signals A can simultaneously be transferred in the two different directions (the control signals C are transferred via one portion of the data lines I/O-line and the address signals A are transferred via a further portion of the data lines I/O-line; this also applies to write operation).

Depending on the configuration of the memory device MEM (e.g. as a DDR-DRAM or as a DRAM of the Rambus type), read-out data I/O and data I/O to be written in can be simultaneously transferred in both directions via the data lines I/O-line. In FIG. 1, customary, separate lines, namely clock signal lines CLK-line, are provided only for the clock signals CLK (or strobe signals, if used). In the drawing, these clock signal lines CLK-line are in each case illustrated as being present in triple fashion. The clock signals CLK and also the strobe signals serve, as is known, to synchronize the memory device MEM with the controller CTRL.

This memory arrangement has at least two advantages over known memory arrangements:

- it is possible to save lines, namely those for the control signals C and for the address signals A, and also associated pads, to be precise both in the controller CTRL and in the memory device MEM. Since, as is known, the controller CTRL and the memory device MEM are each embodied as an integrated circuit, it is thus possible to save valuable chip area which is tantamount to saving costs.
- in the event of changeover from write operation to read operation, and vice versa, waiting or drumming cycles that are often required in conventional memory arrangements are no longer necessary, with the result that overall the entire memory arrangement can be operated at a higher operating speed.

Figure 2:
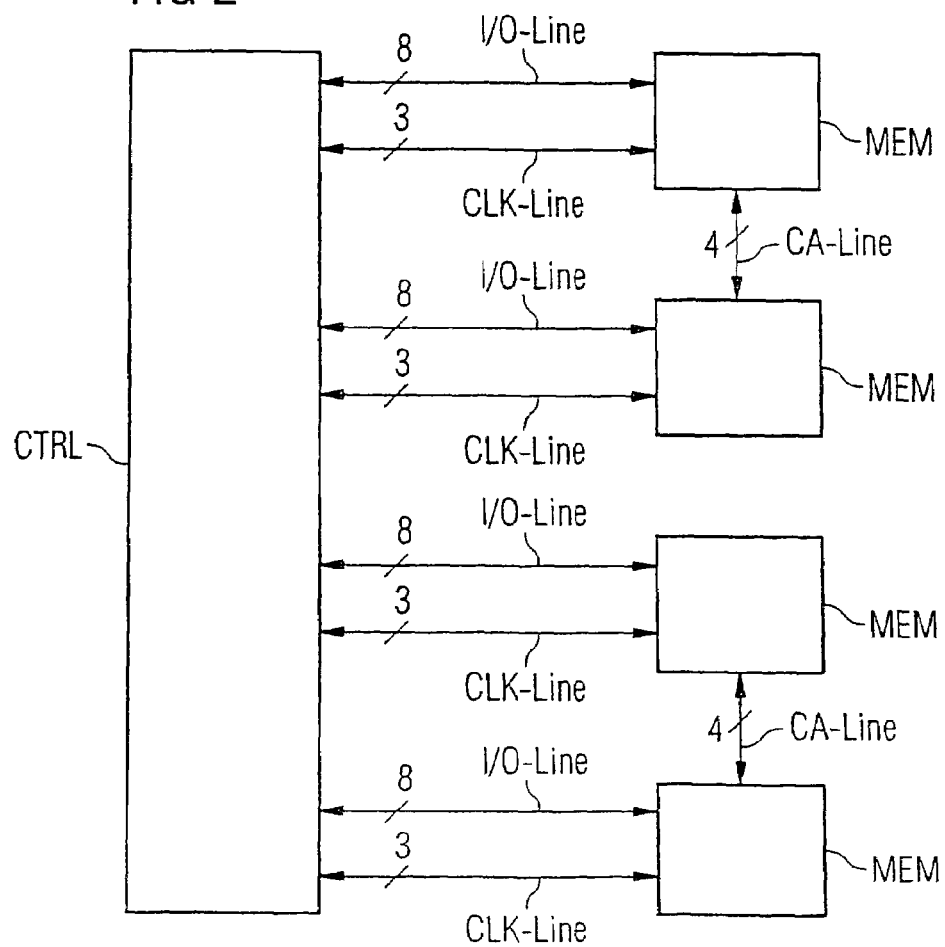
FIG. 2 illustrates another embodiment of a controller CTRL and a memory device in accordance with the invention.

FIG. 2 shows a further advantageous embodiment of the invention. In this case, the controller CTRL is likewise once again designed for 32 data lines I/O-line for data signals I/O. Four memory modules are used as memory devices MEM, which memory modules, however, in contrast to the embodiment described previously, are designed only for in each case eight data lines I/O-line for data signals I/O. Memory devices MEM having a high storage capacity (e.g. 512 MB SDRAM) that are customary nowadays have, in total, more than eight control signals C and address signals A which are to be transferred between the controller CTRL and the respective memory device MEM. Consequently, the number of eight data lines I/O-line between the controller CTRL and a respective individual one of the memory devices MEM is too small for the (according to the invention additional) transfer of the control signals C and of the address signals A. According to an embodiment of the invention, then, provision is made in this case for configuring the individual memory devices MEM with driver and receiver circuits and with memory-internal connections in such a way that, in accordance with the SBD method already presented above, control signals C and/or address signals A can additionally be transferred via control/address lines CA-line directly between individual memory devices MEM.

In the concrete individual case, this may then appear like the illustration in FIG. 2: each of the memory devices MEM is connected to the controller CTRL via eight data lines I/O-line for the simultaneous transfer of eight data signals I/O and for the simultaneous transfer of up to eight control signals C and/or address signals A. Furthermore, the memory devices MEM are connected to the controller CTRL via (for example in each case three) clock lines CLK-line for the transfer of control signals CLK and/or of strobe signals. It is assumed, then, that each of the memory devices MEM requires a total of twelve control signals C and address signals A for its functioning. These signals C, A have to be provided by the controller CTRL and be transferred to the respective memory device MEM. However, only eight of said signals C, A can be transferred to one of the memory devices MEM via the eight data lines I/O-line.

The transfer of the twelve signals A, C is effected, then, as follows, explained with reference to the top two memory devices MEM illustrated in FIG. 2 (it is assumed in this case that the control signals C and address signals A intended for one memory device MEM are identical to the control signals C and address signals A intended for the other memory device MEM): the first eight of the address and/or control signals A, C required are transferred to one memory device MEM (illustrated at the top on the right in FIG. 2) via the first eight data lines I/O-line of the controller CTRL. The last eight of the address and/or control signals A, C required are transferred to the other memory device MEM (on the right in FIG. 2: second device MEM from the top) via the second eight data lines I/O-line of the controller CTRL. This results in the following situation: a first group of four address and/or control signals A, C was transferred exclusively to one memory device MEM from the controller CTRL. A last group of four address and/or control signals A, C was transferred exclusively to the other memory device MEM from the controller CTRL. A middle group of four address and/or control signals A, C was transferred to each of the two memory devices MEM from the controller CTRL. This means that the last group of four address and/or control signals A, C was not transferred to said one memory device MEM from the controller CTRL and that the first group of four address and/or control signals A, C was not transferred to the other memory device MEM.

The memory arrangement in accordance with an embodiment of the present invention is designed in such a way that the last group of four address and/or control signals A, C can be transferred and is transferred to one memory device MEM from the other memory device MEM via control/address lines CA-line, and that the first group of four address and/or control signals A, C can be transferred and is transferred to the other memory device MEM from one memory device MEM via control/address lines CA-line. In this case, the transfer is once again effected by means of the SBD principle. Consequently, it is possible to drive both memory devices MEM with their entire set of control and address signals C, A required. The abovementioned advantages are afforded in this exemplary embodiment, too, even if, compared with the first exemplary embodiment, additional control/address lines CA-line together with associated pads and circuit sections are required to a small extent in the case of the individual memory devices MEM.

The above explanations with regard to the top two memory devices MEM in FIG. 2 likewise apply, of course, to the bottom two memory devices MEM illustrated in FIG. 2. Furthermore, it is also possible, according to the invention, for more than two memory devices MEM to be directly connected to one another via control/address lines CA-line.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed:

1. A memory arrangement comprising:
a controller and a plurality of memory devices, wherein data signals, control signals and address signals are transferred between the controller and the memory devices; and
data signal lines, each data signal line for transferring the data signals as well as the control signals or the address signals between the controller and the memory devices such that the data signals, the control signals and the address signals are transferred between the controller and the memory devices via the data signal lines,
wherein said memory devices are adapted to both, to store data in memory cells thereof and to read out data stored in said memory cells, whereby said data to be stored and to be read out is transferred via said data signal lines,
wherein the memory devices are individually connected to the controller via the data signal lines carrying the data signals, the control signals and the address signals, and
wherein the memory arrangement is adapted to transferring said signals in a Simultaneous Bi-directional Signaling Mode such that all of the data signals, all of the address signals, and all of the control signals are transferable via the data signal lines within one single cycle,
wherein the number of memory devices is chosen such that the total number of data signals that can be transferred between the controller and the memory devices, together with the associated data signal lines, is at least equal to the total number of lines required for transferring the address signals and the control signals between the controller and an individual one of the memory devices,
wherein the total number of data signals that can be transferred between the controller and the individual one of the memory devices, together with the associated data signals, is less than the total number of lines required for transferring the address signals and the control signals between the controller and the individual one of the memory devices, and
wherein the memory devices are configured such that a portion of the control signals and/or of the address signals can be transferred directly between the memory devices.

2. The memory arrangement as in claim 1,
wherein control/address lines are provided for directly transferring the portion of the control signals and/or of the address signals between the memory devices.

3. A memory arrangement comprising:
a controller and a plurality of memory devices, wherein data signals, control signals and address signals are transferred between the controller and the memory devices; and
data signal lines, each data signal line for transferring the data signals as well as the control signals or the address signals between the controller and the memory devices,
wherein said memory devices are adapted to both, to store data in memory cells thereof and to read out data stored in said memory cells, whereby said data to be stored and to be read out is transferred via said data signal lines,
wherein the memory devices are individually connected to the controller via the data signal lines carrying the data signals, the control signals and the address signals,
wherein the memory arrangement is adapted to transferring said signals in a Simultaneous Bi-directional Signaling Mode
wherein the number of memory devices is chosen such that the total number of data signals that can be transferred between the controller and the memory devices, together with the associated data signal lines, is at least equal to the total number of lines required for transferring the address signals and the control signals between the controller and an individual one of the memory devices, and
wherein the total number of data signals that can be transferred between the controller and the individual one of the memory devices, together with the associated data signals, is less than the total number of lines required for transferring the address signals and the control signals between the controller and the individual one of the memory devices, and wherein the memory devices are configured such that a portion of the control signals and/or of the address signals can be transferred directly between the memory devices.

4. The memory arrangement as in claim 3, wherein control/address lines are provided for directly transferring the portion of the control signals and/or of the address signals between the memory devices.

* * * * *